United States Patent
Zhang et al.

(10) Patent No.: US 9,368,439 B2
(45) Date of Patent: Jun. 14, 2016

(54) SUBSTRATE BUILD UP LAYER TO ACHIEVE BOTH FINER DESIGN RULE AND BETTER PACKAGE COPLANARITY

(71) Applicant: NVIDIA Corporation, Santa Clara, CA (US)

(72) Inventors: Leilei Zhang, Sunnyvale, CA (US); Zuhair Bokharey, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/669,175

(22) Filed: Nov. 5, 2012

(65) Prior Publication Data

US 2014/0124944 A1    May 8, 2014

(51) Int. Cl.
*H01L 29/00* (2006.01)
*H01L 23/498* (2006.01)

(52) U.S. Cl.
CPC .... *H01L 23/49827* (2013.01); *H01L 23/49816* (2013.01); *H01L 23/49822* (2013.01); *H01L 23/49894* (2013.01); *H01L 2924/0002* (2013.01)

(58) Field of Classification Search
CPC ........... H01L 2224/32225; H01L 2224/16225; H01L 23/49822; H01L 23/49827; H01L 23/145
USPC ................. 257/E23.062, E23.067, 759, 774; 438/126, 612, 613
See application file for complete search history.

(56) References Cited

U.S. PATENT DOCUMENTS

| | | | | |
|---|---|---|---|---|
| 5,263,243 A | * | 11/1993 | Taneda | H05K 3/0035 156/89.18 |
| 6,711,812 B1 | * | 3/2004 | Lu | H01L 23/3677 174/262 |
| 6,810,583 B2 | * | 11/2004 | Carpenter | H05K 1/115 29/593 |
| 7,037,586 B2 | * | 5/2006 | Yokota | B32B 15/08 427/307 |
| 7,602,062 B1 | * | 10/2009 | Wang | H01L 23/145 257/737 |

(Continued)

OTHER PUBLICATIONS

Mistry et al., A 45nm Logic Technology with High-k+Metal Gate Transistors, Strained Silicon, 9 Cu Interconnect Layers, 193nm Dry Patterning, and 100% Pb-free Packaging, Electron Devices Meeting, 2007. IEDM 2007. IEEE International, pp. 247-250.*

*Primary Examiner* — Jaehwan Oh
(74) *Attorney, Agent, or Firm* — Artegis Law Group, LLP

(57) ABSTRACT

Embodiments of the invention generally relate to package substrates for integrated circuits. The package substrates each include a core having electrically conductive vias therethrough. Build-up layers formed from dielectric materials having different compositions are disposed around the core and include interconnects formed therein for facilitating electrical connections between integrated circuits coupled to the package substrate. The dielectric materials are selected to allow finer interconnect geometries where desired, and to increase the rigidity, and thus planarity, of the package substrate. Exemplary dielectric materials include pre-impregnated composite fibers for increasing the rigidity of a package substrate, and Ajinomoto Build-up Film for allowing the formation finer interconnect geometries.

20 Claims, 2 Drawing Sheets

(56) References Cited

U.S. PATENT DOCUMENTS

| | | | | |
|---|---|---|---|---|
| 7,707,716 B2* | 5/2010 | Song | ...................... | H05K 3/381 29/831 |
| 8,163,642 B1* | 4/2012 | Wang | ................... | H01L 23/145 438/612 |
| 2004/0107569 A1* | 6/2004 | Guzek | ................. | H01L 23/142 29/846 |
| 2004/0251559 A1* | 12/2004 | Lu | ..................... | H01L 23/49816 257/778 |
| 2005/0102830 A1* | 5/2005 | Saiki | ........................ | C23F 1/18 29/847 |
| 2006/0180341 A1* | 8/2006 | Kariya | ............... | H01L 21/4857 174/255 |
| 2007/0261234 A1* | 11/2007 | Song | ..................... | H05K 3/381 29/829 |
| 2007/0281471 A1* | 12/2007 | Hurwitz | ............. | H01L 21/4857 438/638 |
| 2008/0149369 A1* | 6/2008 | Kawamura | .......... | H01L 21/4846 174/251 |
| 2009/0001139 A1* | 1/2009 | Tanno | ................. | H01L 21/4853 228/203 |
| 2010/0139968 A1* | 6/2010 | Takenaka | .......... | H01L 23/49822 174/263 |
| 2010/0140807 A1* | 6/2010 | Kobayashi | ............. | C08G 77/60 257/774 |
| 2013/0133926 A1* | 5/2013 | Kim et al. | ..................... | 174/250 |
| 2014/0217599 A1* | 8/2014 | Teh | ........................ | H01L 24/96 257/773 |

\* cited by examiner

SUBSTRATE BUILD UP LAYER TO ACHIEVE BOTH FINER DESIGN RULE AND BETTER PACKAGE COPLANARITY

BACKGROUND OF THE INVENTION

1. Field of the Invention

Embodiments of the present invention generally relate to packaging integrated circuits, and more specifically, to build-up layers for package substrates.

2. Description of the Related Art

Package substrates are used in the packaging of integrated circuits to provide mounting surfaces for integrated circuits and to facilitate electrical connection therebetween. The package substrates include a plurality of electrically-conductive interconnects for transporting electric current. The interconnects are electrically insulated from one another by a dielectric material, also known as build-up layers, in which the interconnects are formed. Conventional package substrates, however, suffer from several drawbacks.

One conventional type of package substrate uses build-up layers formed from pre-impregnated composite fibers, also known as "pre-preg". Pre-impregnated composite fibers, however, are not able to support high density wiring schemes, and therefore, limit the minimum size that can be obtained for a manufactured device. The formation of interconnects within pre-impregnated fibers generally includes the deposition of a metal foil over the pre-impregnated fibers, and subsequent removal of the undesired portions of the foil by etching. Such processes limit the interconnect densities that can be achieved.

Other conventional package substrates utilize Ajinomoto Build-up Film (ABF) for forming build-up layers. Due to the differences in composition between ABF and pre-impregnated fibers, ABF has different properties than the pre-impregnated fibers. ABF, while capable of supporting high density wiring schemes, is flexible and has a relatively high coefficient of thermal expansion. The high coefficient of thermal expansion increases the likelihood of undesirable bowing and cracking of the package substrate, thus resulting in damage to the integrated circuits coupled thereto.

Therefore, there is a need in the art for a package substrate having build-up layers capable of achieving finer interconnect geometries and increased package planarity.

SUMMARY OF THE INVENTION

Embodiments of the invention generally relate to package substrates for integrated circuits. The package substrates each include a core having electrically conductive vias therethrough. Build-up layers formed from dielectric materials having different compositions are disposed around the core and include interconnects formed therein for facilitating electrical connections between integrated circuits coupled to the package substrate. The dielectric materials are selected to allow finer interconnect geometries where desired, and to increase the rigidity, and thus planarity, of the package substrate. Exemplary dielectric materials include pre-impregnated composite fibers for increasing the rigidity of a package substrate, and Ajinomoto Build-up Film for allowing the formation finer interconnect geometries.

In one embodiment of the invention, a package substrate for integrated circuits is disclosed. The package substrate includes a core having vias therethrough, a first dielectric material disposed over a first side of the core, and a second dielectric material disposed over a second side of the core. A third dielectric material having a different composition than the first dielectric material is disposed over the first dielectric material, and a fourth dielectric material having a different composition than the second dielectric material is disposed over the fourth dielectric material.

Benefits of the invention include package substrates having sufficient rigidity while allowing for finer interconnect geometries. The package substrates utilize multiple dielectric materials to facilitate the simultaneous support of finer or denser interconnect geometries while providing increased rigidity or planarity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally relate to package substrates for integrated circuits. The package substrates each include a core having electrically conductive vias therethrough. Build-up layers formed from dielectric materials having different compositions are disposed around the core and include interconnects formed therein for facilitating electrical connections between integrated circuits coupled to the package substrate. The dielectric materials are selected to allow finer interconnect geometries where desired, and to increase the rigidity, and thus planarity, of the package substrate. The dielectric materials are selected based upon the desired stiffness or rigidity, the desired coefficients of thermal expansion, and the desired patterning capabilities. Exemplary dielectric materials include pre-impregnated composite fibers for increasing the rigidity of a package substrate, and Ajinomoto Build-up Film for allowing the formation finer interconnect geometries.

Figure 1:
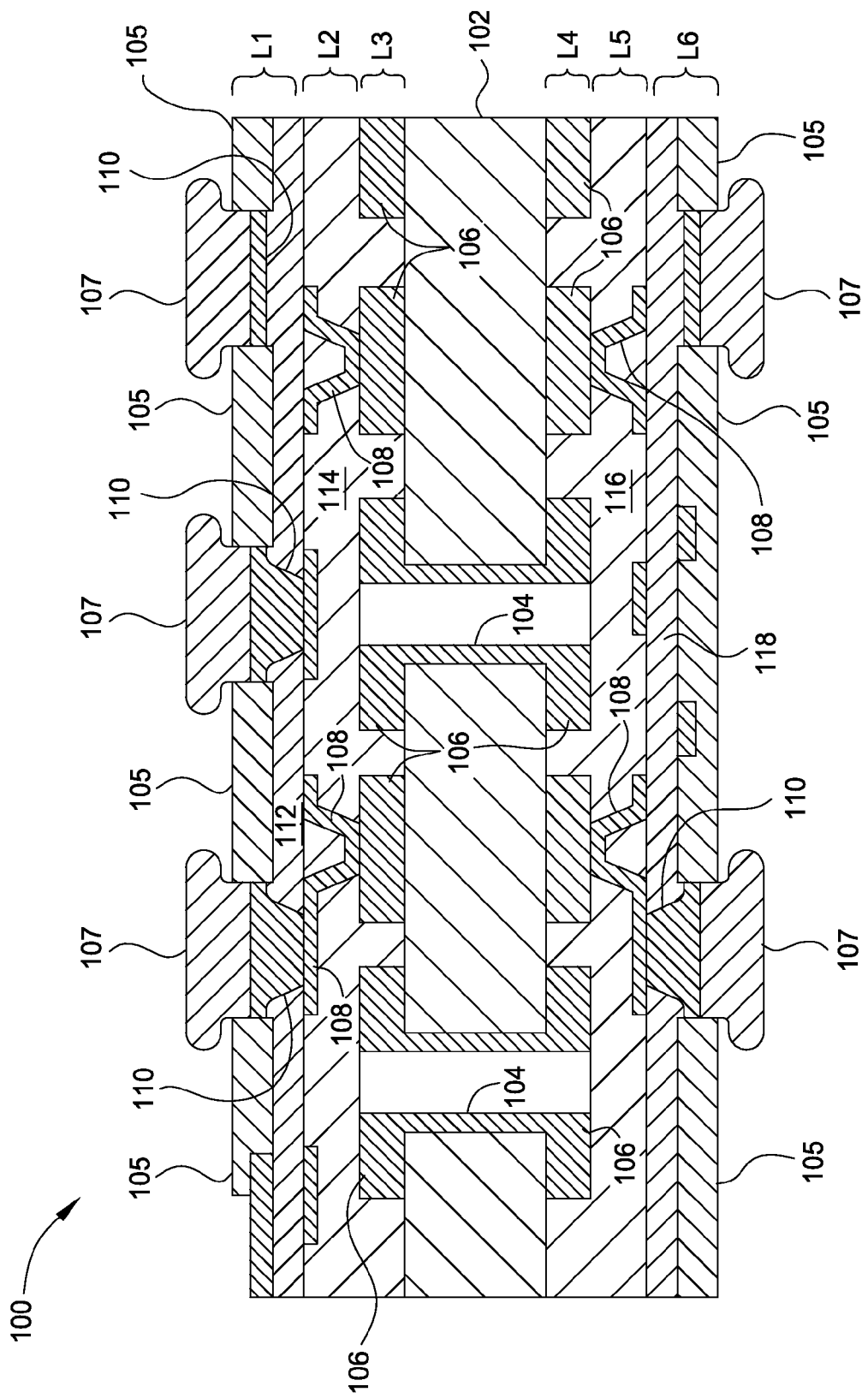
FIG. 1 illustrates a package substrate having build-up layers formed from dielectric materials, according to one embodiment of the invention.

FIG. 1 illustrates a package substrate 100 having build-up layers formed from dielectric materials 112, 114, 116, and 118, according to one embodiment of the invention. The package substrate 100 includes six levels of metallization L1-L6. Levels L3 and L4 are disposed on opposite sides of a core 102 of the package substrate 100. Levels L1 and L2 are disposed over level L3 on a first side of the core 102, and levels L5 and L6 are disposed over level L4 on a second side of the substrate. Solder masks 105 are disposed on the outer surfaces of the package substrate and define areas for applying solder 107 thereto. The solder 107 facilitates an electrical connection between the package substrate 100 and an integrated circuit or printed circuit board coupled thereto.

The core 102 may be, for example, a board material having a dielectric constant of about 4.4 to about 4.8, and includes electrically conductive vias 104 disposed therethrough. The electrically conductive vias 104 are electrically coupled to at least some interconnects 106 within the levels L3 and L4. Some of the interconnects 106, in turn, are electrically coupled to interconnects 108 within the levels L2 and L5. Interconnects 108 may also be electrically coupled to interconnects 110 within levels L1 and L6. It is to be noted that the positioning and electrical connectivity of the interconnects 106, 108, and 110 is shown for illustrative purposes, and is not meant to be limiting of interconnect designs for package substrates. It is contemplated that specific connectivity schemes may developed depending on the application of the package substrate 100.

The interconnects 110 of Level L1 are disposed in a dielectric material 112. The dielectric material 112 electrically isolates the interconnects 110 from one another. The interconnects 108 and 106 of levels L2 and L3 are disposed in a dielectric material 114 that provides electrical insulation between the interconnects 108 and 106, where desired. Similarly, the interconnects 106 and 108 within levels L4 and L5 are disposed in a dielectric material 116 which provides electrical isolation between the interconnects 106 and 108 within levels L4 and L5, where desired. Furthermore, the interconnects 110 within level L6 are disposed within a dielectric material 118 which provides electrical isolation therebetween, as desired. In one example, the dielectric materials 112, 114, 116, and 118 may have a thickness of about 15 micrometers to about 100 micrometers.

Unlike prior art package substrates that utilize a single dielectric material for electrically insulating interconnects 106, 108, and 110 in levels L1-L6, embodiments of the present invention utilize multiple dielectric compositions within the same package substrate 100. The utilization of multiple dielectrics of different compositions allows the dielectric materials 112, 114, 116, and 118 to be selected for specific applications within the package substrate 100. For example, the interconnects 106 and 108 disposed within the levels L2, L3, L4 and L5 utilize a geometry pattern having relatively tight spacing (e.g., high interconnect density). To facilitate a tighter geometry spacing, the dielectric materials 114 and 116 may include Ajinomoto Build-up Film (ABF) which is capable of supporting tightly-spaced interconnect designs. ABF supports dense interconnect geometries because ABF is receptive of plated seed and conductive layers, for example in the micron range, thereby allowing smaller geometries to be formed. ABF, however, is relatively soft and flexible, and therefore may allow the package substrate 100 to bend or flex if used alone or as the only dielectric material for the build-up layers. ABF may include one or more of an epoxy with a phenol hardener, cyanate ester with an epoxy, and cyanate ester with thermosetting olefin.

To reduce bending or flexing of the package substrate 100, the dielectric materials 112 and 118 are selected to provide structure rigidity to the package substrate 100. For example, the dielectric materials 112 and 118 may be pre-impregnated composite fibers or another material containing a fiber matrix along with an epoxy or thermoplastic resin. The pre-impregnated composite fibers are relatively stiff and impart structure rigidity to the package substrate 100. The pre-impregnated composite fibers, however, generally do not allow for interconnect geometries as fine as those supported by ABF. Therefore, the pre-impregnated composite fibers are more suitable for interconnects which do not require tight interconnect spacing, such as interconnects 110 within levels L1 and L6. Thus, pre-impregnated composite fibers should be selected as a dielectric material for the package substrate when tight interconnect geometries are not desired or required.

As illustrated above, the combination of multiple dielectric materials can be utilized to facilitate the formation of fine interconnect geometries while providing sufficient structural rigidity to a package substrate. ABF may be utilized in selected levels to electrically insulate interconnects requiring finer geometries. Finer geometries may include, for example, interconnects having relatively small cross-sectional areas, such as 15 micrometer line/space width and below, utilized in areas of the package substrate 100 having a high interconnect density (e.g., number of interconnects per area or cross-sectional area). Pre-impregnated composite fibers may be used where finer geometry is not necessary, thus increasing the rigidity of the package substrate 100. It is contemplated that the dielectric materials 112, 114, 116, and 118 may be treated to increase adhesion to the interconnects 106, 108, and 110. For example, the dielectric materials 112, 114, 116, and 118 may have a roughness of less than about 1 micrometer, for example, less that about 0.5 micrometers.

While FIG. 1 illustrates a package substrate 100 according to one embodiment of the invention, additional embodiments are also contemplated. For example, it is contemplated that the dielectric materials 114 and 116 may be pre-impregnated composite fibers, while the dielectric materials 112 and 118 may be ABF. In such an embodiment, finer interconnect geometry patterns may be found in levels L1 and L6, while less dense interconnect geometry patterns may be found in levels L2-L5. In another embodiment, it is contemplated that the package substrate 100 need not be symmetrical about a horizontal axis. In such an embodiment, it is contemplated that the dielectric materials 114 and 116, for example, may not both have the same composition. Likewise, the dielectric materials 112 and 118 may not have the same composition.

In yet another embodiment, it is contemplated that the package substrate 100 may include more than six levels of interconnects. In such an embodiment, additional layers of dielectric material may be added to provide adequate electrical insulation while allowing for desired interconnect geometries and substrate stiffness. For example, the package substrate may include 3 levels of metallization in the core, thus forming a 2-3-2 package substrate (e.g., two metallization levels on each side of the core surrounding a core with three metallization levels. Other variations are also contemplated, including 2-4-2, 3-2-3, 4-2-4, and the like.

In another embodiment, it is contemplated that interconnect geometries other than the geometry illustrated in FIG. 1 may be utilized. In such an embodiment, it is contemplated that the dielectric materials 112, 114, 116, and 118 may provide electrical insulation for different levels L1-L6 than is shown. For example, in such an embodiment, dielectric material 112 may provide electrical insulation for interconnects 110 and 108 in levels L1 and L2, while dielectric material 114 provides electrical insulation for interconnects 106 in level L3. Similarly, dielectric material 118 may provide electrical insulation for interconnects 110 and 108 in levels L6 and L5, while dielectric material 116 provides electrical insulation for interconnects 106 in level L4. Thus, the position of the dielectric materials 112, 114, 116, and 118 may be adjusted to accommodate a desired interconnect geometry while still providing structural rigidity to the package substrate 100. In yet another embodiment, the ABF has a dielectric constant of about 3.1 to about 3.3, and the pre-impregnated composite fiber has a dielectric constant of about 4.4 to about 4.6.

Figure 2:
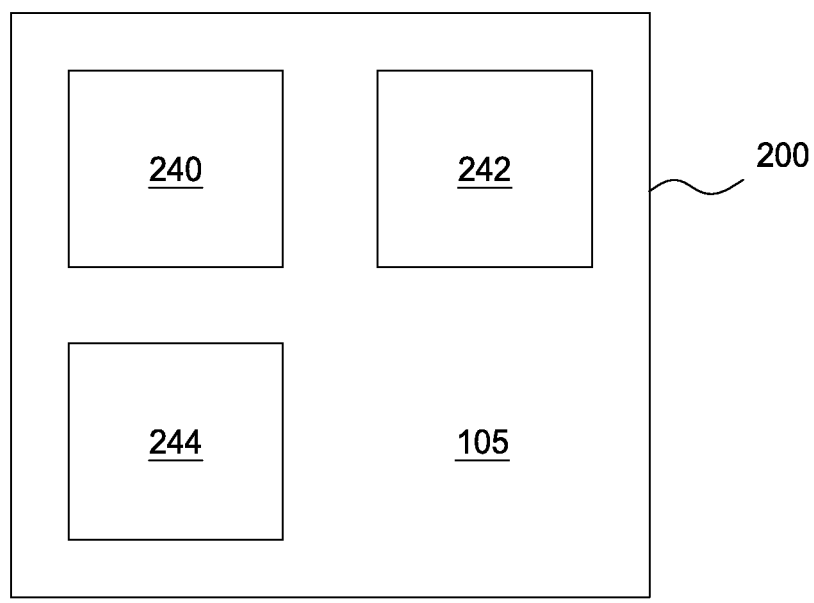
FIG. 2 is a top perspective view of a package substrate having integrated circuits disposed thereon, according to one embodiment of the invention.

FIG. 2 is a top perspective view of a package substrate having integrated circuits disposed thereon, according to one embodiment of the invention. The package substrate 200 is similar to the package substrate 100, but includes sufficient interconnects 106, 108, and 110 (shown in FIG. 1) to support the integrated circuits 240, 242, and 244. The integrated circuits may include, for example, an application processor, a memory component, an RF component, an integrated controller, and the like. While three integrated circuits 240, 242, and 244 are shown coupled to the package substrate 200, it is contemplated that the package substrate 200 may include more or less than three integrated circuits.

Embodiments of the invention generally relate to package substrates for integrated circuits. The package substrates include build-up layers formed from dielectric materials having different compositions. A first dielectric layer having interconnects formed therein is disposed on a first side of a core, and a second dielectric layer having dielectric layers therein is disposed on a second side of the core. A third dielectric layer is disposed on the first dielectric layer, and a fourth dielectric layer is disposed on the second dielectric. In one embodiment, the first and third dielectric layers have a different composition than the second and forth dielectric layers. The compositions of the dielectric layers are selected to allow relatively fine interconnect geometries and to provide structural rigidity to the package substrates.

Benefits of the invention include package substrates having sufficient rigidity while allowing for finer interconnect geometries. The utilization of multiple dielectric materials in a package substrate allows dielectric materials that support finer interconnect geometries to be disposed in areas of the package substrate that include higher interconnect densities. Moreover, more rigid dielectric materials can be utilized in areas of the package substrate where interconnect geometry is less dense and fine geometry is not required, thereby improving the rigidity and planarity of the package substrate.

While the foregoing is directed to embodiments of the present invention, other and further embodiments of the invention may be devised without departing from the basic scope thereof, and the scope thereof is determined by the claims that follow.

What is claimed is:

1. A package substrate for integrated circuits, comprising:
a core having vias therethrough;
a first dielectric material disposed over a first side of the core;
a second dielectric material disposed over a second side of the core;
a third dielectric material disposed over the first dielectric material, the third dielectric material having a different composition than the first dielectric material, wherein the third dielectric material is more rigid than the first dielectric material;
a fourth dielectric material disposed over the second dielectric material, the fourth dielectric material having a different composition than the second dielectric material;
a fifth material disposed over the third dielectric material, the fifth material forming a first solder mask; and
a sixth material disposed over the fourth dielectric material, the sixth material forming a second solder mask.

2. The package substrate of claim 1, wherein the first dielectric material and the second dielectric material have the same composition.

3. The package substrate of claim 2, wherein the third dielectric material and the fourth material have the same composition.

4. The package substrate of claim 1, wherein each of the first dielectric material and the second dielectric comprise Ajinomoto Build-up Film.

5. The package substrate of claim 4, wherein each of the third dielectric material and the fourth dielectric material comprise pre-impregnated composite fibers.

6. The package substrate of claim 1, wherein the core comprises a silicon substrate having a plurality of conductive vias disposed therethrough.

7. The package substrate of claim 1, wherein each of the third dielectric material and the fourth dielectric comprise pre-impregnated composite fibers, and the pre-impregnated composite fibers include a thermoplastic resin.

8. The package substrate of claim 1, wherein each of the third dielectric material and the fourth dielectric comprise pre-impregnated composite fibers, and the pre-impregnated composite fibers include an epoxy.

9. The package of claim 1, wherein each of the first dielectric material, the second dielectric material, the third dielectric material, and fourth dielectric material include a plurality of interconnects disposed therein.

10. The package substrate of claim 9, wherein the first dielectric material and the second dielectric material include Ajinomoto Build-up Film.

11. The package substrate of claim 10, wherein the first dielectric material and the second dielectric material comprise a greater interconnect density than the third dielectric material and the fourth dielectric material.

12. The package substrate of claim 11, wherein the third dielectric material and fourth dielectric material comprise pre-impregnated composite fibers.

13. The package substrate of claim 1, wherein the fourth dielectric material is more rigid than the second dielectric material.

14. The package substrate of claim 1, wherein each of the first dielectric material and the second dielectric comprise pre-impregnated composite fibers.

15. The package substrate of claim 14, wherein each of the third dielectric material and the fourth dielectric material comprise Ajinomoto Build-up Film.

16. The package substrate of claim 1, wherein each of the first dielectric material and the second dielectric comprise pre-impregnated composite fibers, and the pre-impregnated composite fibers include a thermoplastic resin.

17. The package substrate of claim 1, wherein each of the first dielectric material and the second dielectric comprise pre-impregnated composite fibers, and the pre-impregnated composite fibers include an epoxy.

18. The package substrate of claim 9, wherein the first dielectric material and second dielectric material comprise pre-impregnated composite fibers.

19. The package substrate of claim 18, wherein the first dielectric material and the second dielectric material comprise a lower interconnect density than the third dielectric material and the fourth dielectric material.

20. The package substrate of claim 19, wherein the third dielectric material and fourth dielectric material comprise Ajinomoto Build-up Film.

* * * * *